(12) United States Patent
Shavrin et al.

(10) Patent No.: US 11,250,883 B2
(45) Date of Patent: Feb. 15, 2022

(54) DEVICE AND METHOD FOR RECORDING INFORMATION ON A MAGNETIC DATA STORAGE MEDIUM

(71) Applicant: Garnet GmbH, Graz (AT)

(72) Inventors: Konstantin A. Shavrin, Moscow (RU);
Sergei B. Kabaev, Moscow (RU);
Alexei V. Katukhov, Tula (RU);
Aleksandr V. Somov, Zhukovskii Moskovskaya Obl. (RU)

(73) Assignee: GARNET GMBH, Graz (AT)

( * ) Notice: Subject to any disclaimer, the term of this patent is extended or adjusted under 35 U.S.C. 154(b) by 0 days.

(21) Appl. No.: 16/994,263

(22) Filed: Aug. 14, 2020

(65) Prior Publication Data
US 2021/0035607 A1 Feb. 4, 2021

Related U.S. Application Data

(63) Continuation of application No. PCT/RU2018/000084, filed on Feb. 14, 2018.

(51) Int. Cl.
*G11B 11/105* (2006.01)
*G11B 5/00* (2006.01)

(52) U.S. Cl.
CPC .. *G11B 11/10543* (2013.01); *G11B 11/10515* (2013.01); *G11B 11/10582* (2013.01); *G11B 2005/0021* (2013.01)

(58) Field of Classification Search
None
See application file for complete search history.

(56) References Cited

U.S. PATENT DOCUMENTS

| | | |
|---|---|---|
| 5,455,730 A | 10/1995 | Dovek et al. |
| 6,445,667 B1 | 9/2002 | Bemacki et al. |
| 2002/0075786 A1 | 6/2002 | Ikegame |
| 2007/0075315 A1* | 4/2007 | Venema ............ G03F 7/70875 257/72 |
| 2010/0231875 A2* | 9/2010 | Ten .................. G03F 7/70341 355/30 |
| 2012/0038898 A1* | 2/2012 | Klaassen ......... G03F 7/70133 355/71 |

(Continued)

FOREIGN PATENT DOCUMENTS

JP 2007148112 A 6/2007

OTHER PUBLICATIONS

International Search Report from PCT/RU2018/000084, filed Feb. 14, 2018, dated Nov. 1, 2018.

*Primary Examiner* — Tan X Dinh
(74) *Attorney, Agent, or Firm* — Patentbar International PC

(57) ABSTRACT

Disclosed is a device for recording information on a magnetic data storage medium which comprises a magnetic field source designed to be capable of generating a magnetic field in the region where the magnetic data storage medium is arranged; a source of electromagnetic radiation at a matrix of controllable mirrors; and a matrix of controllable mirrors mounted in a housing so as to be capable of reflecting electromagnetic radiation by means of the controllable mirrors into the region where the magnetic data storage medium is arranged and/or in another direction. The present invention makes it possible to record information on a fixed magnetic data storage medium.

5 Claims, 4 Drawing Sheets

(56) References Cited

U.S. PATENT DOCUMENTS

| | | | |
|---|---|---|---|
| 2015/0138523 A1* | 5/2015 | Jak | G03F 7/70625 |
| | | | 355/67 |
| 2015/0145151 A1* | 5/2015 | Van Der Schaar | H01L 23/544 |
| | | | 257/797 |
| 2019/0004435 A1* | 1/2019 | De Jager | B22F 12/00 |
| 2019/0011841 A1* | 1/2019 | De Jager | G03F 7/704 |

* cited by examiner

DEVICE AND METHOD FOR RECORDING INFORMATION ON A MAGNETIC DATA STORAGE MEDIUM

RELATED APPLICATIONS

This Application is a Continuation Application of International Application PCT/RU2018/000084, filed on Feb. 14, 2018, which is incorporated herein by reference in its entirety.

FIELD OF THE INVENTION

The present invention relates to the field of information technology, in particular, to devices and methods for recording information on magnetic data storage medium.

BACKGROUND OF THE INVENTION

Data storage devices are known in the form of magnetic disks, for example see U.S. Pat. No. 5,455,730. Writing to such discs is carried out with use of a magnetic field source commonly called a magnetic head. During the recording process, the magnetic disk rotates, and the magnetic head modulates in time the magnetic field near the magnetic disk in such a way that the structure of the magnetic field on the magnetic track having the shape of a circle corresponds to the recorded information. After recording information on one circular magnetic track, the magnetic head is radially displaced to the center or edge of the magnetic disk and the information is then recorded in the next magnetic track.

The readout of the recorded information is also carried out when the disc rotates. Magnetic field structure of the magnetic track of the rotating disc induces currents in the magnetic readout head, the magnitude of which corresponds to the structure of the magnetic field of the magnetic track. After reading one track, the magnetic head is displaced radially to the center or edge of the magnetic disk and then information is read from the next magnetic track.

The disadvantage of a magnetic data storage medium in the form of a magnetic disk is the need to use moving parts: first, it is necessary to rotate the disk itself, and second, the magnetic head must be moved in the radial direction of the disk to read information from the entire area of the disk where it is recorded.

SUMMARY OF THE INVENTION

An object of the present invention is to provide information recording on a stationary magnetic data storage medium.

The object of the present invention is achieved by means of a device for recording information on a magnetic data storage medium comprising: a magnetic field source configured to generate a magnetic field in the area of the magnetic medium; a source of electromagnetic radiation configured to generate electromagnetic radiation and direct the generated electromagnetic radiation to an array of controlled mirrors; and the array of controlled mirrors installed in the housing with the possibility of reflecting electromagnetic radiation by controlled mirrors to the area where the magnetic medium is located and/or to the other side.

The electromagnetic radiation is preferably optical and the source of the electromagnetic radiation is preferably a laser. The array of controlled mirrors preferably comprises rotatable micromirrors.

The device may comprise a control unit comprising: a magnetic field source control module, an electromagnetic radiation source control module, a controllable mirror matrix control module, a memory configured to store sequences of commands and/or information to be recorded, and a processor configured to obtain data from the memory and control the magnetic field source control module, the electromagnetic radiation source control module, and the controllable mirror array control module.

In an advantageous embodiment, the device has a housing containing a magnetic field source, an electromagnetic radiation source and an array of controlled mirrors, and also configured to place the magnetic data storage medium inside or outside the housing. The device can also contain a distance control element locating the array of controlled mirrors on itself in relation to the location of the magnetic data storage medium.

In addition, the device may contain mirrors and/or prisms and/or lenses and/or objectives made with the possibility of converting and/or transferring electromagnetic radiation from the source of electromagnetic radiation to the array of controlled mirrors and/or from the array of controlled mirrors to the location of the magnetic medium information. In some embodiments, the device may comprise temperature sensor of a magnetic layer of the magnetic data storage medium, for example, an infrared sensor, and/or a timer. The magnetic data storage medium is supposed to be immovable in relation to the device (in particular, the source of the magnetic field). The electromagnetic radiation should preferably be a non-destructive magnetic data storage medium or its magnetic layer.

The device is preferably made with the possibility of generating electromagnetic radiation of such duration, which provides heating of the magnetic data storage medium in the required areas up to a temperature that is higher than the Curie point or the temperature of magnetization compensation, but less than the temperature of destruction and/or loss of magnetic properties of the magnetic data storage medium. In an advantageous embodiment, the duration of the electromagnetic radiation corresponds to the energy required to heat up to the temperature that is higher than the Curie point or the temperature of magnetization compensation, but less than the temperature of destruction and/or loss of magnetic properties of a magnetic data storage medium, divided by the power of electromagnetic radiation. The duration of the electromagnetic radiation is preferably shorter than the time required to transfer heat from those areas of the magnetic data storage medium that require heating to those areas that do not require heating.

The object of the present invention is also achieved by a method for recording information on a magnetic data storage medium with use of the device according to any of the above-described embodiments, the method comprises the following steps: generating electromagnetic radiation and directing it to the array of controlled mirrors by the electromagnetic radiation source; reflecting electromagnetic radiation or its first part into the area of the magnetic data storage by the array of controlled mirrors; generating a magnetic field with a first direction and/or magnitude by the magnetic field source; after the temperature of the magnetic layer of the magnetic data storage medium in those areas to which the matrix of controlled mirrors reflects electromagnetic radiation or its first part, has increased to or above the Curie point, reflecting the second part of the electromagnetic radiation by the matrix of controlled mirrors into the area where the magnetic medium is located; after cooling the magnetic layer of the magnetic data storage medium in those areas of the magnetic layer of the magnetic data storage medium to which the array of controlled mirrors does not reflect electromagnetic radiation below the Curie point, forming a magnetic field with a second direction and/or magnitude by the magnetic field source; after the temperature of the magnetic layer of the magnetic data storage medium in those areas to which the matrix of the controlled mirrors reflects the second part of the electromagnetic radiation, has increased to or above the Curie point, turning off the source of electromagnetic radiation; after cooling the magnetic layer of the magnetic data storage medium in those areas of the magnetic layer of the magnetic data storage medium, onto which the matrix of controlled mirrors reflected the second part of the electromagnetic radiation, below the Curie point, turning off the source of the magnetic field generating the magnetic field with the second direction and/or magnitude.

In a preferred embodiment the method comprises a step, where after the temperature of the magnetic layer of the magnetic data storage medium in those areas to which the array of controlled mirrors reflects electromagnetic radiation or its first part has increased up to or above the Curie point, and before the array of controlled mirrors reflects the second part electromagnetic radiation into the area of the magnetic medium, turning off the source of electromagnetic radiation and after cooling the magnetic layer of the magnetic data storage medium below the Curie point, turning off the source of the magnetic field, and then generating electromagnetic radiation and directing it to the matrix of controlled mirrors by the source of electromagnetic radiation.

In one embodiment of the method, during the step of generating the magnetic field with the first direction and/or magnitude by the magnetic field source, the array of controlled mirrors reflects all electromagnetic radiation into the area of the magnetic medium, and during the step of generating the magnetic field with a second direction and/or magnitude by the magnetic field source, the array of controlled mirrors reflects a part of the electromagnetic radiation corresponding to the recorded information.

In another embodiment of the method, during the step of generating the magnetic field with the first direction and/or magnitude by the magnetic field source, the array of controlled mirrors reflects a part of the electromagnetic radiation corresponding to the recorded information into the area of the magnetic medium, and during the step of generating the magnetic field with the second direction and/or magnitude by the source magnetic field, the matrix of controlled mirrors reflects an inverse part of the electromagnetic radiation corresponding to the recorded information into the area of the magnetic medium location.

In another embodiment of the method, during the step of generating the magnetic field with the first direction and/or magnitude by the magnetic field source, the array of controlled mirrors reflects the inverse part of the electromagnetic radiation corresponding to the recorded information into the area of the magnetic medium, and during the step of generating the magnetic field with the second direction and/or magnitude the magnetic field source, the matrix of controlled mirrors reflects into the area of the magnetic medium the part of the electromagnetic radiation corresponding to the recorded information.

The technical result of the present invention is the recording of information (with the possibility of rewriting) on a stationary magnetic medium in the form of a spatial magnetic structure (mainly flat) using spatially modulated (in a plane parallel to the surface of the magnetic medium) electromagnetic radiation, which heats separate areas of the magnetic medium to a temperature not less than the Curie temperature or the temperature of compensation of magnetization, but less than the temperature of irreversible changes of the magnetic medium.

An additional technical result of the present invention is the ability to change the information recording density (i.e. the amount of information in relation to the area of the medium used for recording) in a simple way by changing the magnification (reduction) factor of the optical system.

DETAILED DESCRIPTION OF THE PREFERRED EMBODIMENTS

In the following, preferred embodiments of the present invention are described with reference to the accompanying figures. The presented embodiments are not limiting the scope of the present invention and are described only for the explanation of the present invention.

Figure 1:
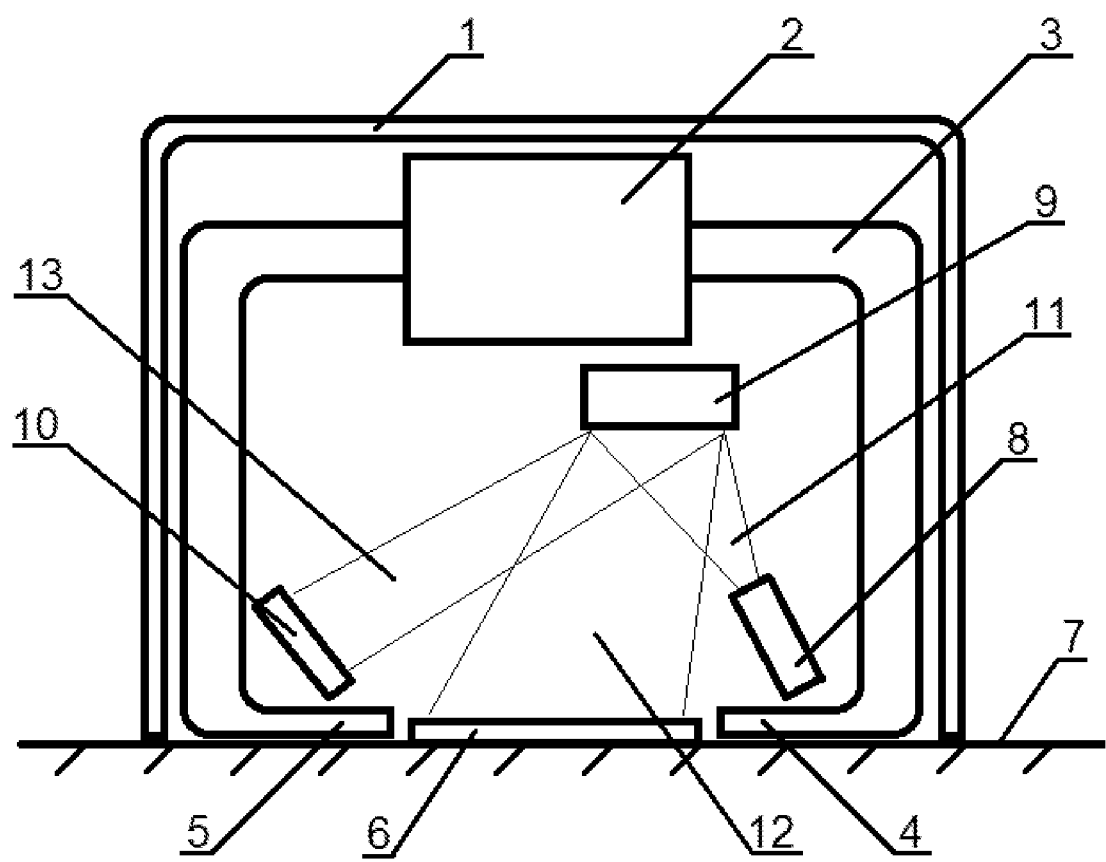
FIG. 1 shows an exemplary embodiment of a device in accordance with the present invention.

FIG. 1 shows an example of an embodiment of a device for recording on a stationary magnetic data storage medium 6. The device consists of a housing 1, which houses a magnetic field source 2 on a magnetic circuit 3, an electromagnetic radiation source 8, a matrix of controlled mirrors 9 and an absorber 10. For recording, the device is applied to surface 7 in a way that the magnetic data storage medium 6 disposed on the surface 7 is in the predetermined location of the magnetic data storage medium, as shown in FIG. 1, in particular, between the poles 4 and 5 of the magnetic circuit 3 in such a way that the electromagnetic radiation 12 reflected by the array of controlled mirrors 9 falls on the magnetic data storage medium 6.

A magnetic data storage medium contains a layer of a substance that can change the magnetization vector (its direction and/or magnitude) of its individual regions (domains, pixels) if it is placed in a magnetic field and/or heated to the Curie point or the temperature of magnetization compensation. The substance can be, for example, a polymer containing ferromagnetic particles inside the layer of this substance and/or on its surface, and/or other particles having a magnetization vector. Such a substance layer can be called a magnetic layer and/or a data layer.

The magnetic data storage medium is advantageously designed as a flat object, as shown in FIG. 1. In particular, the simplest structure of the data storage medium contains only the above-described magnetic layer. This layer can be applied to other objects, such as packaging, merchandise, and other items. In a more complex embodiment, the magnetic data storage medium consists of a carrier layer on which the above-described magnetic layer is applied. Such a magnetic medium can be embedded or adhered to other objects. In this order it can also be provided with an adhesive layer, preferably on the side of the carrier layer where no magnetic layer is provided. Other types of structures of the magnetic data storage medium are also possible.

Magnetic data storage media can be used for various purposes, for example, to identify the items provided with those, such as goods, cargo, documents, securities, banknotes, etc. Magnetic storage media can also be used to store information about the objects provided with those, for example, about their characteristics, methods of use, safety requirements, manufacturer, to store instructions for use and advertising information.

To record information on magnetic data storage medium, in most cases, a magnetic field source is required, which is a magnet, in particular an electromagnet. The use of an electromagnet makes it possible to control the magnitude and direction of the magnetic field applied to the magnetic data storage medium without mechanical movement of the magnetic field source, only by turning on/off/switching the electric current flowing in the electromagnet. Due to this, the overall dimensions of the device for recording information on the magnetic data storage medium are minimized, and the reliability of the device is achieved. In addition, with the help of an electromagnet, if required, it is possible to create a magnetic field with a greater value than with the use of permanent magnets.

In some embodiments, the magnetic field source can have multiple magnets, including multiple electromagnets. Within the framework of the present invention, all magnets and electromagnets are considered to be parts of a single source of magnetic field. If there are several magnets and/or electromagnets in the magnetic field source, some of them can generate magnetic field of one direction and/or magnitude, and others of another direction and/or magnitude. In addition, these magnets and/or electromagnets can generate magnetic field of one and the other direction and/or magnitude together. If there is only one magnet or electromagnet in the source of the magnetic field, it can generate both magnetic fields of one and the other directions and/or magnitudes.

The source of the magnetic field must generate magnetic field in the area, where the magnetic data storage medium is located. This can be provided in several ways. In the first embodiment, the source of magnetic field should be located at such a distance from the magnetic data storage medium, which makes it possible to create a magnetic field in the location of the magnetic data storage medium, which is sufficient to ensure the reversal magnetization of the necessary areas (domains, pixels) of the magnetic data storage medium. In the case of using an electromagnet as a source of magnetic field, it is possible to regulate the distance at which the required magnitude of the magnetic field is created by changing the strength of the current passing through the electromagnet. In another embodiment, shown in FIG. 1, a magnetic field source 2, for example an electromagnet, may be equipped with a magnetic circuit 3 for transferring a magnetic field from the magnetic field source to the location of the magnetic data storage medium. In this embodiment, it is possible to locate the source of the magnetic field in the place of the housing, which is required to fulfill such conditions as a convenient balance of masses, a space for the passage of electromagnetic radiation to the magnetic data storage medium, and other arrangement requirements.

Moreover, the magnetic circuit can be combined with a magnetic field concentrator, which allows concentration of all possible magnetic field from the magnetic field source in a volume designed to accommodate the magnetic data storage medium. Taking into account the fact that the magnetic data storage medium can have much smaller dimensions than the magnetic field source, the use of magnetic field concentrators allows reducing of the magnitude of the magnetic field generated by the magnetic field source, since the concentrator provides concentration at the location of the magnetic data storage medium of a more part of the field generated by the source of magnetic field than a part of the field induced in this area by the magnetic field source without using the concentrator.

Recording information on the immovable magnetic data storage medium is complicated by the fact that the magnetic field generated by the source of the magnetic field is sufficiently extended and, therefore, a separate element (area, pixel, domain) of the resulting magnetization of the stationary magnetic data storage medium will be quite large, which reduces the possible achievable information recording density. Moreover, to record several information pixels (areas, domains, elements) on the magnetic data storage medium, it is required to move the magnetic field source relative to the magnetic data storage medium, which is usually realized by rotating a magnetic disk or pulling a magnetic tape relative to a non-mobile magnetic field source (a magnetic head). It is also possible that the source of the magnetic field moves relative to the immovable magnetic data storage medium, however, in a sense, this can also be considered as the movement of the magnetic data storage medium relative to the source of the magnetic field.

The object of the present invention is to provide recording of information on a magnetic data storage medium, which is immovable relative to the device for recording information and, in particular, relative to the source of the magnetic field. Since the source of the magnetic field is stationary relative to the magnetic data storage medium and has a sufficiently extended magnetic field, it is possible to provide such a configuration of the recording device in which the magnetic data storage medium will be in a continuous uniform magnetic field, as shown, for example, in FIG. 1. Recording of information in this case should be ensured by regulating the susceptibility of the material of which the magnetic layer consists to the magnetic field (or by regulating the retention of the magnetization of the magnetic layer).

Such regulation of the susceptibility can be performed by selectively heating the magnetic layer of the magnetic data storage medium, wherein the material of it becomes susceptible to an external magnetic field, when it is heated to a certain temperature called the Curie temperature (Curie point), and, after cooling, it can retain the magnetization set by the external magnetic field. In another embodiment, it is also possible to control the retention of the magnetization of the magnetic layer by heating the material of the magnetic layer to a temperature of self-compensation (relaxation) of the magnetization. The type of regulation can be selected by selecting the material of the magnetic layer with the required properties.

To generate electromagnetic radiation, there can be used a source of electromagnetic radiation heating the entire magnetic data storage medium or some of its parts. In particular, the magnetic (data) layer is heated, for example, some of its regions (domains, pixels) or the entire information surface of this layer. With this heating, the magnetic layer can be heated to the Curie point or magnetization compensation temperature.

When the magnetic layer is heated to the Curie point, the substance that forms this magnetic layer changes the magnetization vector (its direction and/or magnitude) of its individual areas (domains, pixels) or the entire information surface, in the case when it is placed in a magnetic field created, for example, by the source of magnetic field. When the magnetic layer is heated to the temperature of the magnetization compensation, the magnetic moments of the particles being a part of the material of the layer and previously oriented in a certain way, providing a given magnetization, turn back and cancel the macroscopic magnetic moment or lose magnetization. In order to provide the opportunity to record information in the form of a structured magnetic field (magnetization) of a magnetic data storage medium, electromagnetic radiation falling to the magnetic data storage medium must be non-destructive, since in a case of destruction of the magnetic data storage medium, in particular, its magnetic layer, it is impossible to create a given magnetization of the magnetic data storage medium, including the structured magnetization. Moreover, non-destructive electromagnetic radiation also provides the opportunity to rewrite information on the magnetic data storage medium, as well as the secrecy of information recorded on the magnetic data storage medium, because the presence of information can only be determined using a magnetization (magnetic field) visualizer, if there is no any damage to the storage medium. Thus, the source of electromagnetic radiation should primarily be a source of non-destructive electromagnetic radiation.

In the preferred embodiment, the electromagnetic radiation is optical radiation, which provides a higher information density than infrared radiation. In addition, it is desirable that the electromagnetic radiation is generated by a laser, since in this case the optical scheme of the device is simplified, since the coherence of the laser radiation provides its low scattering. In order to make this radiation non-destructive, its power should preferably have a value from 0.01 mW (preferably from 0.1 mW) to 1 mW (preferably not more than 5 mW or 10 mW) per 1 $\mu m^2$. These limitations can be combined into ranges in any combination and depend on the material of the magnetic data storage medium, including the material of the substrate and the material of the magnetic layer. Hereinafter, the magnetic data storage medium is, for example, a magnetic tape. Its substrate is made on the basis of polymers (for example, polyethylene terephthalate (lavsan) or polyimides) or other materials, and the magnetic layer is made on the basis of chromium dioxide or other magnetic materials. At the same time, these possible embodiments of the magnetic data storage medium do not limit the present invention, and other magnetic storage media can be used.

The indicated values of the power of electromagnetic radiation also depend on the duration of exposure of the magnetic data storage medium to radiation. The electromagnetic radiation preferably should be of such duration that it heats the magnetic data storage medium in the required regions to a temperature that is higher than the Curie point or the temperature of magnetization compensation, but less than the temperature of destruction and/or loss of magnetic properties of the magnetic data storage medium. For example, for the specified example of the magnetic data storage medium, this temperature should be more than 100° C. and less than 200° C.

To heat up to such a temperature, the magnetic data storage medium indicated as an example and having an area of 1 $cm^2$ needs to transfer energy, the value of which can vary from 1 to 100 J depending on the characteristics of the materials from which the magnetic data storage medium is made. Depending on the power of the electromagnetic radiation, the duration of the electromagnetic radiation required to heat the magnetic data storage medium to the required temperature will be different. In the example under consideration, it can be from 1 $\mu s$ to 1 s. This corresponds to a short burst of an electromagnetic radiation source such as a laser or other. In the general case, the duration of electromagnetic radiation corresponds to the energy required for heating to a temperature that is higher than the Curie point or the temperature of compensation of magnetization, but less than the temperature of destruction and/or loss of magnetic properties of a magnetic data storage medium, divided by the power of electromagnetic radiation. The structure of the magnetization (magnetic field) of a magnetic data storage medium is set using spatially structured electromagnetic radiation, in particular, radiation modulated in space. When such a spatially structured electromagnetic radiation hits a magnetic data storage medium, the heating of the magnetic layer occurs unequally depending on how the electromagnetic radiation is spatially distributed: where it falls on a magnetic data storage medium, its magnetic layer heats up, and where radiation does not arrive or comes in a small amount, no heating or slight heating is observed.

With a sufficient exposure time, in those places where electromagnetic radiation falls on the magnetic data storage medium, the magnetic layer may heat up to the Curie temperature (point) or to the temperature of magnetization compensation, while in those places where the radiation does not enter or is received in small quantities, the temperature will be below the Curie temperature (point) or the magnetization compensation temperature. In this case, the magnetization of the magnetic layer of the magnetic data storage medium becomes structured (in other words, spatially modulated), since in those places where heating has occurred, the magnetization changes under the influence of an external magnetic field or without such an action, and where heating has not occurred or has happened by an insufficient amount, the magnetization remains the same.

Depending on the properties of the magnetic data storage medium, it may be necessary for the duration of the electromagnetic radiation to be shorter than the time required to transfer heat from those regions of the magnetic data storage medium that require heating to those regions that do not require heating. This is due to the fact that the elevated temperature of the heated area of the magnetic data storage medium will cause thermal transfer processes to the area that has not been heated. In order that, after heating the required areas of the magnetic medium to a temperature above the Curie point or the temperature of magnetization compensation, those areas that do not need to be heated, it is necessary to stop heating by electromagnetic radiation, and as a result, those areas of the magnetic data storage medium that do not need to be heated will not reach the temperature above the Curie point or magnetization compensation temperature. This imposes a limitation on the duration of electromagnetic radiation, the value of which depends on the properties of the materials with which the magnetic data storage medium is made and in some cases can have a value in the range from 10 $\mu s$ to 10 s.

In this way information in the form of a magnetization structure can be recorded on a magnetic data storage medium, which in one direction can represent, for example, a sequence of regions with different magnetizations. In a particular case, there can be only two types of magnetization of the regions of the magnetic layer. For example, these can be regions with magnetization vectors directed in two different directions, or regions with different magnetization values, in the particular case with zero (compensated) magnetization and nonzero, having a certain value. Such a structure of the magnetization of a magnetic data storage medium with two types of magnetization regions in one direction or another can be converted into a binary sequence, for example, 0 and 1. Determination of the structure of the magnetization of the magnetic layer of a magnetic data storage medium with the purpose of subsequent conversion into symbolic sequences can be carried out using magneto-optical converters or using other devices and methods known from the prior art.

Spatially structured electromagnetic radiation is created using an element that provides spatial modulation of a uniform unmodulated radiation flux. Such an element providing spatial modulation in accordance with the present invention is an array of controlled mirrors. A flat array (matrix) of controlled mirrors consists mainly of identical micromirrors, which can be controlled (rotated) depending on the signals, currents or voltages supplied to the micromirror control elements. Thus, the steering mirror array is in an advantageous embodiment a rotatable mirror array.

In a preferred embodiment, each micromirror is fixed on two posts and can be rotated to two opposite positions relative to the middle position. The turn can be carried out due to the electrostatic attraction of one or the other platform. Due to the small size of the mirrors, they create small losses and have a long service life. In addition, the small size of micromirrors makes it possible to create arrays of mirrors with a large number of rows and columns, from several tens to several thousand. For example, typical micromirror matrices can have 600×800, 1280×720, 1920×1080 and other numbers of micromirrors. Thanks to such numbers of elements modulating electromagnetic radiation in the form of micromirrors, it is possible to record large amounts of information on a magnetic data storage medium in one pass of the information recording process.

The array of controlled mirrors (micromirrors) is installed as shown in FIG. 1, so that in one of the rotated positioned micromirrors the electromagnetic radiation 11 (mainly laser optical radiation) is reflected from the source of electromagnetic radiation 8 to the location of the magnetic data storage medium 6, in particular, to its magnetic layer, and in the other rotated position the micromirrors reflect electromagnetic radiation 11 in a different direction, which does not fall on the magnetic data storage medium. In order for the electromagnetic radiation 13, which is not reflected on the magnetic data storage medium, to create glare and does not interfere with the information recording process, such electromagnetic radiation 13 is predominantly reflected on the absorber 10.

All of the above-described elements of the device for recording information on a stationary magnetic data storage medium can be connected to each other in a configuration allowing the device to operate and perform its functions. At the same time, in a preferred embodiment, these elements or part of them are attached to the housing, which, in addition to the function of mechanical retention, also acts as a screen preventing any electromagnetic radiation from escaping from the device, except for that which is directed at a magnetic data storage medium. In order to prevent the ingress of glare and radiation reflected inside the housing, the inner surface of the housing can be made to absorb electromagnetic radiation (for example, light-absorbing).

The housing can also be used to position a magnetic data storage medium in relation to the storage device and its constituent elements. The magnetic data storage medium can be placed next to the housing and/or in the housing in the required orientation, position and at a given distance relative to the array of controlled mirrors. This is necessary in order to ensure that information is recorded in the required place on the magnetic layer of the data storage medium.

In addition, depending on the type of the source of electromagnetic radiation and its location relative to the array of controlled mirrors, and also depending on the use of such optical elements as prisms, mirrors, lenses and/or objectives, the flow of electromagnetic radiation can be parallel, converging or diverging. In the case of converging or diverging fluxes of electromagnetic radiation, the size of the pixels and the area of the entire flux of electromagnetic radiation incident on a magnetic data storage medium depends on the distance at which the magnetic data storage medium is located from the array of controlled mirrors. Thus, by changing the position of the magnetic data storage medium relative to the array of controlled mirrors (in particular, the distance between them), it is possible to change the information recording density on the magnetic data storage medium.

The change in the distance from the matrix of controlled mirrors to the magnetic data storage medium can be changed by their mechanical approach/distance to/from each other, for which a mechanism can be provided in the device body that regulates the position of the matrix of controlled mirrors and/or the magnetic data storage medium. To implement such a possibility, the device (for example, as a part of the housing or inside the housing) can be provided with an element for adjusting the distance, at which the array of controlled mirrors is located in relation to the location of the magnetic data storage medium. In another embodiment, various slots, protrusions or other types of seats for a magnetic data storage medium can be provided in the device housing, when installed into which the magnetic data storage medium is located at different distances from the array of controlled mirrors between these versions. The housing can additionally accommodate one or more prisms, mirrors, lenses and/or objectives that can change the characteristics of electromagnetic radiation fluxes: convert the flow into parallel, expanding or narrowing, and/or change the area of the flow reflected by the matrix of controlled mirrors and projected on a magnetic data storage medium. These prisms, mirrors, lenses and/or objectives can be made adjustable in position relative to each other, the source of electromagnetic radiation, the array of controlled mirrors and/or the location of the magnetic data storage medium, which can also allow adjusting the density of information recording on the magnetic data storage medium.

In a preferred embodiment, the body is made using polymeric materials, but it can be made using other materials, including metals, fabrics, wood, etc. In the proposed variants of use, the device for recording information on a stationary magnetic data storage medium is a separate device, in connection with which its body can be made in the form of a separate unit. However, in some cases, the device may be included in other devices, devices and/or complexes, and then the body of the device for recording information on a magnetic data storage medium can be considered the body of those devices, devices and/or complexes that include the device.

Figure 2:
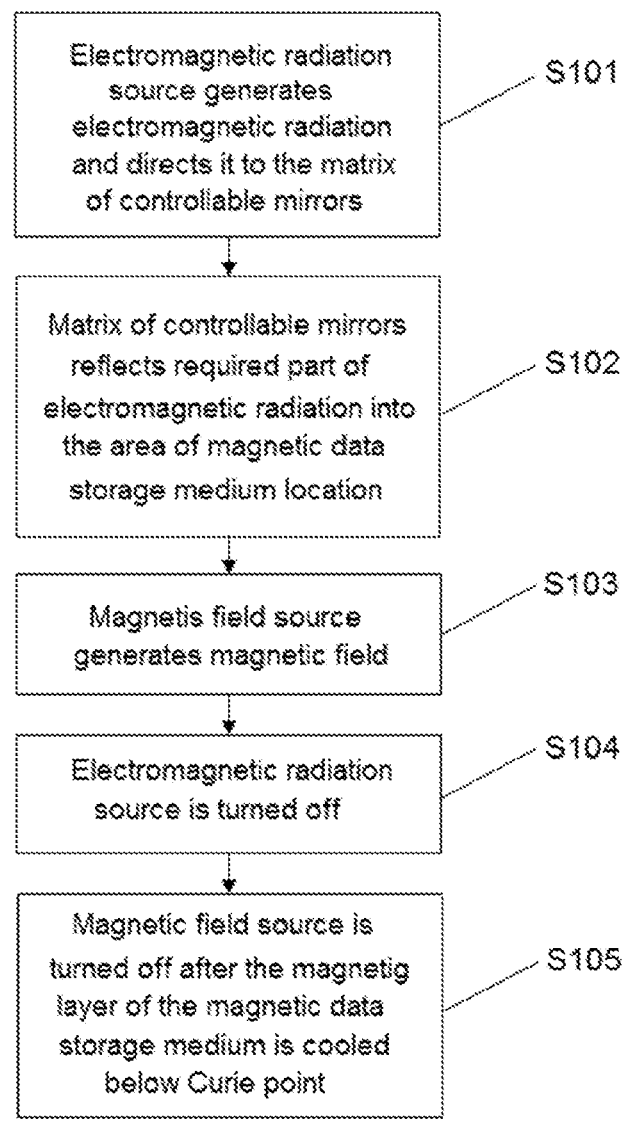
FIG. 2 shows the simplest version of the recording method.

To record information on a stationary magnetic data storage medium, it is necessary to perform the following actions shown in FIG. 2. First, in step S101, the source of electromagnetic radiation must generate electromagnetic radiation and then direct the generated electromagnetic radiation to the array of controlled mirrors or to a guide device transferring and/or directing electromagnetic radiation to the array of controlled mirrors. Then, at step S102, the array of controlled mirrors in accordance with the given spatial structure of electromagnetic radiation (and, accordingly, the required spatial structure of the magnetization of the magnetic layer) must reflect the required part of the electromagnetic radiation into the area of the magnetic data storage medium or a guide device that carries and/or guides the reflected electromagnetic radiation to the location of the magnetic data storage medium.

The magnetic field source may turn on and generate (start generating) a magnetic field in the location of the magnetic data storage medium before, during, or after the above steps. In order to carry out the reorientation of the magnetization, the magnetic layer of the magnetic data storage medium must be heated to or above the Curie temperature. Therefore, whenever the source of the magnetic field is turned on and whenever it begins to form (generate) a magnetic field, the magnetic field will reorient the polarization of the magnetic layer only after heating the corresponding regions (domains, pixels) of the magnetic layer to or above the Curie temperature.

In this regard, with a single recording or recording processes separated from each other by a long time interval, the time of starting the magnetic field source and the beginning of the formation (generation) of the magnetic field in comparison with the time of formation of the electromagnetic radiation beam and its direction (reflection) to the location of the magnetic data storage medium doesn't matter. In the embodiment of the recording method shown in FIG. 2, the magnetic field source starts to generate the magnetic field in step S103.

During the formation of magnetization, the magnetic field is predominantly retained until the heated regions (domains, pixels) cool below the Curie temperature (points) so that the created magnetization does not weaken or self-compensate after removing the magnetic field until the heated region (domain, pixel) cools.

Therefore, according to the method of FIG. 2, first turn off the source of electromagnetic radiation at step S104 so that the magnetic data storage medium (more precisely, the previously heated areas, domains, pixels of its magnetic layer) can cool below the Curie point, and only then turn off the source of the magnetic field at step S105. The temperature of the magnetic layer of the magnetic data storage medium can be determined, for example, using an infrared sensor, which makes it possible to determine the temperature in a non-contact way and, as a consequence, such a sensor does not require contact with the magnetic data storage medium and can be placed in the body of the recording device.

The write-once method shown in FIG. 2, makes it possible to create the required structure of the magnetization of the magnetic layer of the magnetic data storage medium and, thereby, to write information on the magnetic data storage medium only if, prior to the recording process, the structure of the magnetization of the magnetic layer was uniform (continuous, unidirectional (the same) in all areas of the magnetic layer) and the direction of the magnetization was known before the recording process so that the magnetization of individual regions (domains, pixels) of the magnetic layer, created during the recording of information on a magnetic data storage medium, had a direction and/or magnitude different from the magnetization before the recording process, since otherwise, the magnetization created during the recording process will be indistinguishable from the magnetization observed before, during and after the recording process in adjacent regions (domains, pixels) where no magnetization and/or magnetization reversal was performed during the recording process.

In connection with the above, it is preferable to use a two-time (two-stage) recording, which can be performed in several versions. In one of these embodiments, shown in FIG. 3, before performing the above-described recording process in the information recording step (steps S211 to S215), the magnetization alignment of the magnetic layer is performed over the entire recordable surface in the preliminary step (steps S201 to S205). For this, in a preliminary step, a recording process similar to that shown in FIG. 2, however, the spatial structure of the reflected electromagnetic radiation is uniform (the same) over the entire area of the reflected light beam, for which all elements of the matrix of controlled mirrors are transferred to a position that reflects electromagnetic radiation from the source of electromagnetic radiation to the location of the magnetic data storage medium.

Accordingly, the magnetic layer of the magnetic data storage medium over the entire area, which is exposed to electromagnetic radiation, is heated to or above the Curie temperature and magnetized in accordance with the magnetic field, which is formed by the magnetic field source in the area of the magnetic data storage medium and this field will be uniform and the same for throughout this area. Next, after this preliminary step of equalizing the magnetization over the entire writeable area of the magnetic layer, which may be called "erasing", the step of writing information is carried out, which contains steps similar to those described above with respect to FIG. 2.

In order for the generated magnetization (information type) corresponding to the recorded information to be isolated against the background of the magnetization previously aligned during the erasure stage (background magnetization), the magnetic field during the recording of information must have a different direction and/or a larger value . . . . In the event that the difference between the magnetic fields is provided only in magnitude, the magnetic field formed later should be greater in magnitude than that formed in front of it, because this is the only way to form different magnetizations in view of the fact that if the field formed later is less, it will not change the magnitude of the magnetization created by the stronger previous field.

Figure 3:
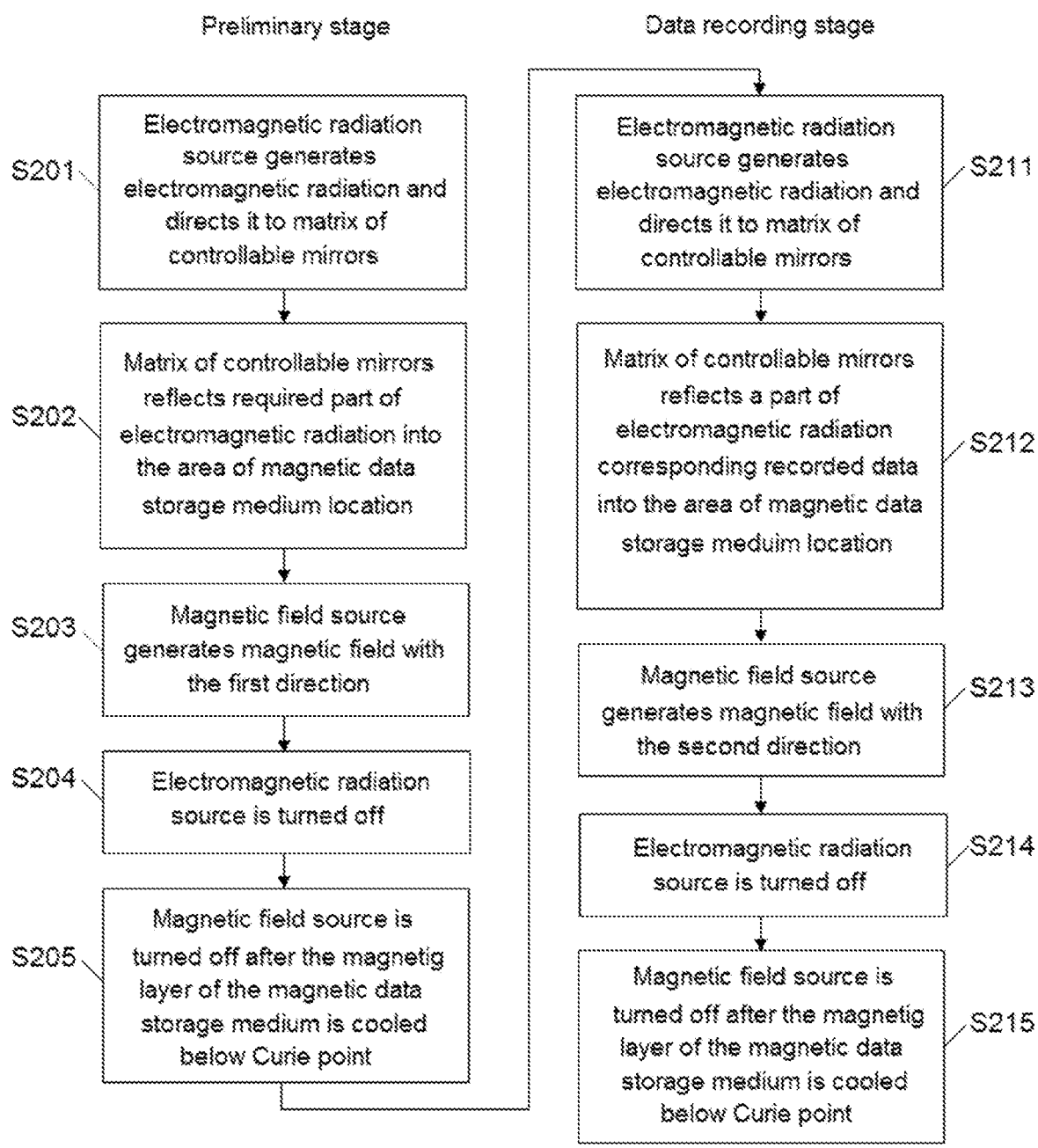
FIG. 3 shows a first embodiment of a recording method in accordance with the present invention.

In the example shown in FIG. 3, the magnetic field in the preliminary step and the recording step has different directions ("first direction" in step S203 and "second direction" in step S213). This simplifies the implementation of the method, since in one of the variants it is possible to use the same source of the magnetic field in the form of an electromagnet, and change the direction by changing the direction of the current supplied to the electromagnet.

Figure 4:
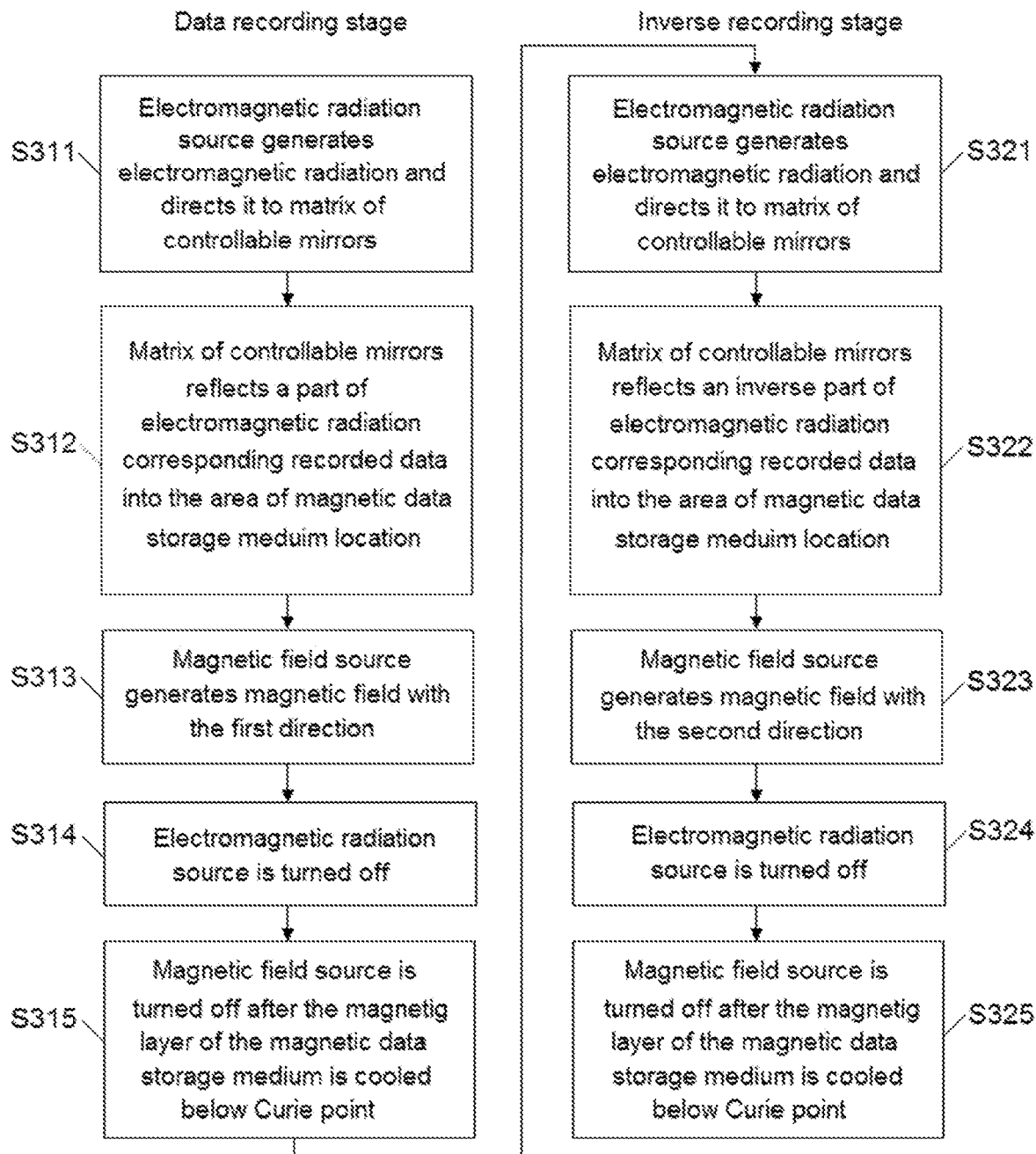
FIG. 4 shows a second embodiment of a recording method in accordance with the present invention.

In another embodiment of recording information on a magnetic data storage medium, shown in FIG. 4, it is possible to double the implementation described with respect to FIG. 2 of the information recording method, wherein in the first stage (information recording step, steps S311-S315) magnetization of the first (informational) type is formed in those regions (domains, pixels) of the magnetic layer that correspond to the recorded information, and in the second step (inverse recording step, steps S321-S325) in all other regions (domains, pixels) of the magnetic medium, magnetization of the second (background) type is formed. For this, during the second stage of recording by forming the background magnetization, the matrix of controlled mirrors inverts the spatial structure of the beam of electromagnetic radiation by turning the micromirrors to positions opposite to those that were at the first stage. As a result, those areas (domains, pixels) of the magnetic layer that were heated at the first stage to or above the Curie temperature are cooled below the Curie point, and those areas (domains, pixels) that were not heated begin to heat up to or above the Curie temperature.

After the areas (domains, pixels) of the recording at the first stage have cooled down below the Curie point, and the areas (domains, pixels) that were not recorded at the first stage heat up to or above the Curie point, it is possible to start forming (generate) a magnetic field necessary for the formation of magnetization of the second (background) type, which differs from the magnetization of the first (information) type. For this, the magnetic field created by the magnetic field source at the second stage must differ from the magnetic field created by the magnetic field source at the first stage in direction and/or magnitude (in particular, be larger in magnitude). As with the method shown in FIG. 3, the method of FIG. 4 records in the first and second steps using magnetic fields of different directions ("first direction" in step S313 and "second direction" in step S323), which creates the same advantages in the implementation of the method.

In both of the above with respect to FIGS. 3 and 4 variants of the two-stage process of recording information, the magnetic fields formed by the source of the magnetic field at both stages should differ from each other in direction and/or magnitude. In the preferred embodiment shown in FIGS. 3 and 4, embodiments of the invention, the magnetic fields generated by the source of the magnetic field at different stages, and the magnetizations of different regions (domains, pixels) of the magnetic data storage medium differ in direction which are opposite. In this embodiment, it is possible to form only two types of magnetization, which will correspond to the binary code (alphabet).

In the event that the magnetic fields used in both stages are opposite in direction with respect to each other, the magnetic regions (domains, pixels) are maximally distinguishable from each other, since they have oppositely directed magnetizations. Another advantage of this option is that reverse magnetic fields can be easily generated by the same magnetic field source. If the source of the magnetic field is made in the form of an electromagnet, then the direction of the magnetic field is reversed in a simple way by applying a reverse electric current to the electromagnet.

Comparing the method diagrams in FIG. 2-4, you can see that they contain similar steps: at steps S101, S201, S211, S311, S321, the source of electromagnetic radiation generates electromagnetic radiation and directs it to the matrix of controlled mirrors (directly or through the transmission/preformation system of electromagnetic radiation, which may contain lenses, prisms, mirrors and/or lenses); at steps S102, S202, S212, S312, S322, the array of controlled mirrors reflects electromagnetic radiation or a part of it in the area of the magnetic medium (directly or through the system for transmitting/preforming electromagnetic radiation, which may contain lenses, prisms, mirrors and/or objectives); at steps S103, S203, S213, S313, S323, the magnetic field source forms a magnetic field with one direction or another and/or value; in steps S104, S204, S214, S314, S324, the electromagnetic radiation source is turned off after the temperature of the magnetic layer of the magnetic data storage medium has risen to or above the Curie point; and in steps S105, S205, S215, S315, S325, the magnetic field source is turned off after cooling the magnetic layer of the magnetic data storage medium below the Curie point.

The difference between the methods and the steps of the methods depicted in FIG. 2-4, is that at steps S102, S212, S312, the array of controlled (adjustable) mirrors reflects into the area of the magnetic data storage medium a part of the electromagnetic radiation corresponding to the recorded information (that is, with the spatial structure of electromagnetic radiation corresponding to the recorded information), in step S202, the array of controlled mirrors reflects all electromagnetic radiation (continuous flow, without spatial structuring) into the area of the magnetic data storage medium, and in step S322, the array of controlled mirrors reflects into the area of the magnetic data storage medium the inverse part of the electromagnetic radiation corresponding to the recorded information (i.e. with an inverse spatial structure of electromagnetic radiation compared to the step S312).

In addition, if at step S103 there are no requirements for the magnetic field generated by the magnetic field source, then at steps S203, S213, S313, S323 there is such a requirement for the magnetic field: the magnetic fields at steps S203 and S213 must differ from each other in the direction and/or value; the same requirement applies to steps S313 and S323.

With regard to the method in FIG. 4, it can be noted that the steps of information recording and inverse recording can be reversed. That is, in contrast to the order shown directly in FIG. 4, the invention can be implemented by first performing steps S321 to S325 and then steps S311 to S315.

In addition, with regard to steps S204 and S211, as well as steps S314 and S321, it can be noted that they can be excluded from the method while maintaining the possibility of implementing the invention. For this, step S205 must be performed after step S212, and step S315 must be performed after step S322, respectively. In this case, step S205 may be combined with step S213 in the form of the step "switching (changing) the magnetic field generated by the magnetic field source from the first direction (and/or magnitude) to the second direction (and/or magnitude) after cooling the magnetic layer of the magnetic of the storage medium in those areas (domains, pixels) where electromagnetic radiation no longer falls or falls in small amounts below the Curie point" with execution after step S212. The same combination can be performed for steps S315 and S323, followed by step S322.

In such variants of the methods, the magnetization of regions (domains, pixels) formed after switching the matrix of controlled mirrors at steps S212 and S322, respectively, will first occur with the first direction (value) set by steps S203 and S313, respectively, and then, after switching (changes) of the magnetic field, with the second direction (magnitude). This double formation of magnetization can adversely affect some types of materials from which the magnetic layer of a magnetic data storage medium is made. In addition, the long-term preservation of the source of electromagnetic radiation in the on state at a time when the magnetic field has not yet changed, adversely affects the energy consumption and causes excessive heating of the device. Therefore, the embodiments shown in FIGS are preferred. 3 and 4 to avoid these problems.

It should be borne in mind that the names "first", "second", "one", "other" in relation to the magnetic field and electromagnetic radiation do not mean the order of formation of the magnetic field with the corresponding characteristics or the order of reflection of parts of the electromagnetic radiation by the matrix of controlled mirrors. These names also do not have a direct connection with the magnetic field, electromagnetic radiation and magnetization, corresponding to the recorded information or inverse to it. In the course of recording, the recording stages can be reversed and, accordingly, part of the electromagnetic radiation reflected by the array of controlled mirrors in accordance with the recorded information can be called both "first" and "second", both "one" and "another".

In addition, a portion of electromagnetic radiation referred to in one part of the specification or one claim as "first" does not necessarily correspond to a portion of electromagnetic radiation referred to in another part of the specification or another claim as "first" or "second", and vice versa. The correspondence between the name of the part of the electromagnetic radiation "first" or "second" needs to be observed only within one claim and/or within the description of one embodiment of the recording method. It should also be noted that the "first" part of electromagnetic radiation is not necessarily accompanied by the "first" characteristic of the magnetic field (its direction and/or magnitude), and the same applies to the names "second" part of electromagnetic radiation and the "second" characteristic of the magnetic field.

As noted earlier, the magnetic field used to create one type of magnetization should mainly be turned off after the regions (domains, pixels) of the magnetic layer, in which the formation of magnetization took place at the previous stage, has cooled below the Curie temperature (point). In addition, the magnetic field for the formation of another type of magnetization at the next stage should mainly be turned on after the regions (domains, pixels) of the magnetic layer, in which the formation of magnetization took place at the previous stage, cooled down below the Curie temperature (point), since otherwise they can completely or partially change the magnetization in the next step.

Therefore, in parallel with the above-described method steps, the temperature of the magnetic layer can be measured. As noted earlier, such a measurement is more convenient to perform with an infrared sensor, which can determine the temperature contactlessly from the infrared radiation of the magnetic layer. When using an infrared or other temperature sensor, before performing steps S105, S201, S215, S315, S325, the readings of the sensor can be compared with the Curie temperature of the magnetic layer of the magnetic data storage medium on which information is recorded. According to the results of comparison, the process of temperature measurement and comparison can be repeated again if the temperature of the magnetic layer is higher than the Curie temperature, or the magnetic field can be switched off if the temperature of the magnetic layer is below the Curie temperature. The use of a temperature sensor makes it possible to directly measure and compare the temperature of the magnetic layer of a magnetic data storage medium, and guarantees that the magnetic field is switched off only after the temperature drops below the Curie point.

In another embodiment, the switching off of the magnetic field source can be carried out after switching off the source of electromagnetic radiation or changing the spatial structure of electromagnetic radiation by reconfiguring the array of controlled mirrors after a certain time, greater than or equal to the time of cooling the magnetic layer from the temperature to which it was heated to a temperature below the Curie point. This time can be determined with the stability of the heating temperature of the magnetic layer and the knowledge of the Curie temperature of the material from which the magnetic layer of the magnetic data storage medium is made. The use of a timer simplifies the component composition of the device and the algorithm (method) of its operation.

The recording of information on the magnetic layer of the magnetic data storage medium can be carried out both immediately on the entire area of the magnetic layer available for recording, and on individual sectors or parts of this area available for recording. The recording in each sector or part of the magnetic layer can be performed by any of the above methods. In addition, the preliminary formation of a homogeneous magnetization structure (including the erasure of previously available information) can be carried out over the entire area of the magnetic layer available for recording, and recording can be performed in parts or sectors of this area without the need to create a homogeneous magnetization structure in each part or sector. magnetic layer, which simplifies the recording process.

In addition to the above-described embodiments of the recording process, a process is also possible in which information is recorded without switching on the source of the magnetic field due to the relaxation process or self-compensation of the previously created magnetization. The implementation of this method can be done in this way. First, a uniform, uniform magnetization is created in the magnetic layer of a magnetic data storage medium using a magnetic field generated by a magnetic field source, and then a spatially modulated (structured) beam of electromagnetic radiation is fed to the magnetic layer, selectively reflected by a matrix of controlled mirrors from a source of electromagnetic radiation in accordance with the recorded information. In those places of the magnetic layer where electromagnetic radiation falls, the magnetic layer heats up to or above the relaxation temperature (self-compensation) of the magnetization, self-compensation (relaxation) of magnetization occurs and, thus, a spatially structured magnetization is created in the magnetic layer, that is, information is recorded.

To control the device for recording information on a stationary magnetic data storage medium, a control unit can be used, which can be included in the device or be a separate device and connected to the device for recording information. The control unit contains the following modules: magnetic field source control module, electromagnetic radiation source control module, rotary mirror matrix control module, processor, memory. The control unit works as follows. The processor receives information that must be recorded on a stationary magnetic data storage medium. This information is temporarily recorded in memory, from where program commands and other information necessary for the operation of the device are sent to the processor.

Under the control of the processor executing the program from the memory, the control modules control the respective devices so that the process of recording information on the stationary magnetic data storage medium is performed in accordance with one or more of the above-described recording processes. The information being recorded is transferred from the memory to the processor and then to the control device for the array of rotary mirrors at the moment in time when it is necessary to form the spatial structure of electromagnetic radiation. In the processor, the recorded information can be encoded and/or encrypted, as well as transformed so as to be recorded on the magnetic data storage medium in accordance with a predetermined rule or standard.

Modules/blocks can be combined, replaced or divided into other elements. They can be implemented in hardware, software, or hardware/software. Data processing can be analog or digital, all the necessary types of signal conversion can be carried out in terms of type, size, shape, sign and other parameters. The control unit can be made of separate components, microcircuits or programmable devices, including computers, controllers, etc.

The above descriptions of the embodiments of the present invention are given only for the purpose of clarifying its essence and are not intended to limit the scope of protection of the invention, which is defined by the following claims.

What is claimed is:

1. A method of recording information on a magnetic data storage medium using a device for recording information on a magnetic data storage medium comprising a magnetic field source configured to generate magnetic field in an area of the magnetic storage medium, a source of electromagnetic radiation configured to generate electromagnetic radiation and direct generated electromagnetic radiation to a matrix of controlled mirrors, and the matrix of controlled mirrors installed in a housing with an ability to reflect electromagnetic radiation by controlled mirrors to the area of the magnetic storage medium and/or to the other side, the method comprising:

generating the electromagnetic radiation and directing the electromagnetic radiation to the matrix of controlled mirrors;

reflecting the electromagnetic radiation or a first part of the electromagnetic radiation into the area of the magnetic medium by the matrix of controlled mirrors;

generating the magnetic field with a first direction and/or magnitude by the magnetic field source;

reflecting a second part of the electromagnetic radiation by the matrix of controlled mirrors in an area where the magnetic medium is located after increasing a temperature of the magnetic layer of the magnetic data storage medium in those areas to which the matrix of controlled mirrors reflects the electromagnetic radiation or the first part of the electromagnetic radiation to or above the Curie point;

generating the magnetic field with a second direction and/or magnitude by the magnetic field source after cooling the magnetic layer of the magnetic data storage medium in those areas of the magnetic layer of the magnetic data storage medium to which the matrix of controlled mirrors does not reflect the electromagnetic radiation below the Curie point;

turning off the source of the electromagnetic radiation after the temperature of the magnetic layer of the magnetic data storage medium in those areas to which the matrix of the controlled mirrors reflects the second part of the electromagnetic radiation has increased to or above the Curie point;

turning off the source of the magnetic field forming the magnetic field with the second direction and/or magnitude after cooling the magnetic layer of the magnetic data storage medium in those areas of the magnetic layer of the magnetic data storage medium onto which the matrix of controlled mirrors reflected the second part, of the electromagnetic radiation below the Curie point.

2. The method according to claim 1, further comprising:
turning off the source of the electromagnetic radiation after increasing the temperature of the magnetic layer of the magnetic data storage medium in those areas to which the matrix of controlled mirrors reflects the electromagnetic radiation or the first part of the electromagnetic radiation to or above the Curie point and before reflecting the second part of electromagnetic radiation in the area of the magnetic medium by the matrix of controlled mirrors;

turning off the source of the magnetic field after cooling the magnetic layer of the magnetic data storage medium below the Curie point; and generating the electromagnetic radiation by the source of the electromagnetic radiation and directing the electromagnetic radiation to the matrix of controlled mirrors.

3. The method according to claim 1, wherein during generating the magnetic field with the first direction and/or magnitude of the magnetic field by the magnetic field source, the matrix of controlled mirrors reflects all electromagnetic radiation into the area of the magnetic medium, and wherein during generating the magnetic field with the second direction and/or magnitude of the magnetic field by the source of the magnetic field, the matrix of controlled mirrors reflects a portion of the electromagnetic radiation corresponding to recorded information.

4. The method according to claim 1, wherein during generating the magnetic field with the first direction and/or magnitude of the magnetic field by the magnetic field source, the matrix of controlled mirrors reflects a portion of the electromagnetic radiation corresponding to recorded information into the area of the magnetic medium, and wherein during generating the magnetic field with the second direction and/or magnitude by the magnetic field source, the matrix of controlled mirrors reflects an inverse portion of the electromagnetic radiation corresponding to recorded information into the area of the magnetic medium.

5. The method according to claim 1, wherein during generating the magnetic field with the first direction and/or magnitude by the source of the magnetic field, the matrix of controlled mirrors reflects an inverse portion of the electromagnetic radiation corresponding to recorded information into the area of the magnetic medium, and wherein during generating the magnetic field with the second direction and/or magnitude by the magnetic field source generates, the matrix of controlled mirrors reflects into the area of the magnetic medium a portion of the electromagnetic radiation corresponding to recorded information.

* * * * *